(12) United States Patent
McConnelee et al.

(10) Patent No.: US 8,008,125 B2
(45) Date of Patent: Aug. 30, 2011

(54) SYSTEM AND METHOD FOR STACKED DIE EMBEDDED CHIP BUILD-UP

(75) Inventors: Paul Alan McConnelee, Albany, NY (US); Kevin M. Durocher, Waterford, NY (US); Donald Paul Cunningham, Dallas, TX (US)

(73) Assignee: General Electric Company, Schenectady, NY (US)

( * ) Notice: Subject to any disclaimer, the term of this patent is extended or adjusted under 35 U.S.C. 154(b) by 34 days.

(21) Appl. No.: 12/399,083

(22) Filed: Mar. 6, 2009

(65) Prior Publication Data

US 2010/0224992 A1 Sep. 9, 2010

(51) Int. Cl.
*H01L 21/00* (2006.01)

(52) U.S. Cl. .......... 438/109; 438/125; 257/686

(58) Field of Classification Search ........ 257/686, 257/777; 438/107, 109, 125
See application file for complete search history.

(56) References Cited

U.S. PATENT DOCUMENTS

| | | | | |
|---|---|---|---|---|
| 5,353,498 | A * | 10/1994 | Fillion et al. | 29/840 |
| 5,567,657 | A | 10/1996 | Wojnarowski et al. | |
| 5,703,400 | A | 12/1997 | Wojnarowski et al. | |
| 6,159,767 | A * | 12/2000 | Eichelberger | 438/107 |
| 6,528,348 | B2 * | 3/2003 | Ando et al. | 438/109 |
| 7,122,403 | B2 | 10/2006 | Chandran et al. | |
| 7,282,390 | B2 * | 10/2007 | Tan et al. | 438/109 |
| 2002/0020898 | A1 | 2/2002 | Vu et al. | |
| 2005/0047094 | A1 * | 3/2005 | Hsu et al. | 361/704 |
| 2006/0043573 | A1 | 3/2006 | Hedler et al. | |
| 2006/0202331 | A1 * | 9/2006 | Hu | 257/737 |
| 2008/0318413 | A1 | 12/2008 | Fillion et al. | |
| 2009/0039491 | A1 | 2/2009 | Kim et al. | |

FOREIGN PATENT DOCUMENTS

| | | |
|---|---|---|
| EP | 1367645 A2 | 12/2003 |
| EP | 1763295 A2 | 3/2007 |
| JP | 11045955 A | 2/1999 |
| JP | 2002246536 A | 8/2002 |
| JP | 2002246745 A * | 8/2002 |
| JP | 2003234432 A | 8/2003 |
| JP | 2005317903 A | 11/2005 |
| WO | 2009009436 A2 | 1/2009 |

* cited by examiner

*Primary Examiner* — Leonardo Andújar
(74) *Attorney, Agent, or Firm* — Ziolkowski Patent Solutions Group, SC; Jean K. Testa

(57) ABSTRACT

An embedded chip package (ECP) includes a plurality of re-distribution layers joined together in a vertical direction to form a lamination stack, each re-distribution layer having vias formed therein. The embedded chip package also includes a first chip embedded in the lamination stack and a second chip attached to the lamination stack and stacked in the vertical direction with respect to the first chip, each of the chips having a plurality of chip pads. The embedded chip package further includes an input/output (I/O) system positioned on an outer-most re-distribution layer of the lamination stack and a plurality of metal interconnects electrically coupled to the I/O system to electrically connect the first and second chips to the I/O system. Each of the plurality of metal interconnects extends through a respective via to form a direct metallic connection with a metal interconnect on a neighboring re-distribution layer or a chip pad on the first or second chip.

24 Claims, 11 Drawing Sheets

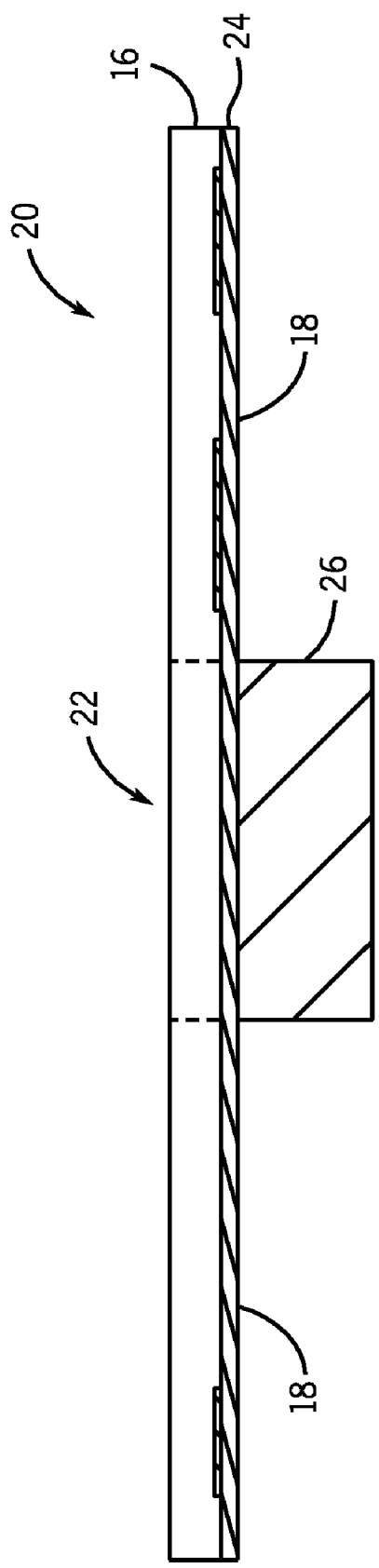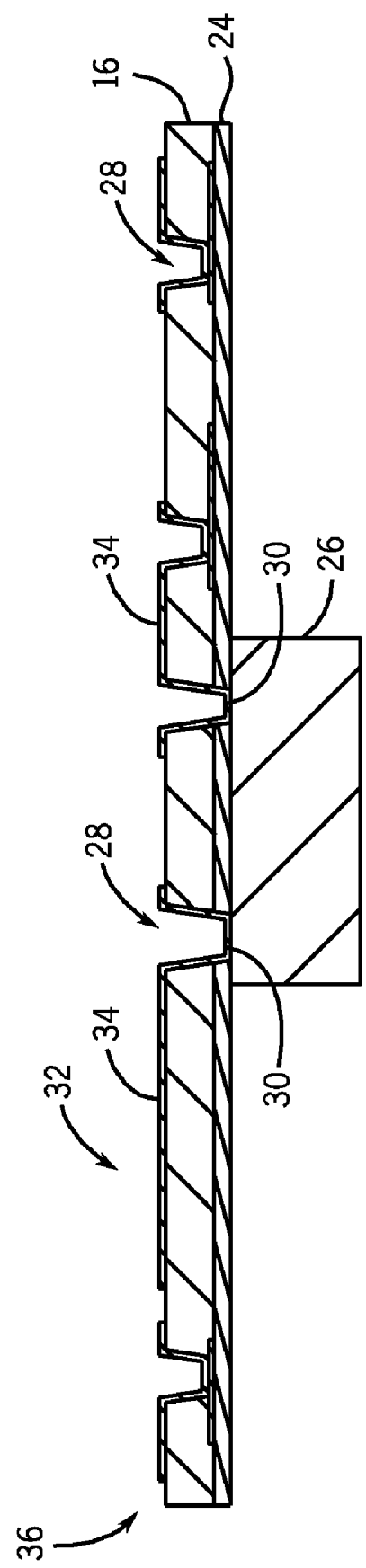
FIG. 3A
FIG. 3B

SYSTEM AND METHOD FOR STACKED DIE EMBEDDED CHIP BUILD-UP

BACKGROUND OF THE INVENTION

Embodiments of the invention relate generally to integrated circuit packages and, more particularly, to embedded chip build-up that uses low resistance metal interconnects directly to the chip bond pad or electrical component connection pad, allowing higher device speeds, lower power consumption, and smaller size. Embedded chip packages can be manufactured having a plurality of chips or electronic components in a stacked 3D arrangement. The plurality of chips or electronic components are electrically connected to an input/output system by way of metal interconnects routed through a plurality of laminate re-distribution layers.

As integrated circuits become increasingly smaller and yield better operating performance, packaging technology for integrated circuit (IC) packaging has correspondingly evolved from leaded packaging, to laminated-based ball grid array (BGA) packaging, to chip scale packaging (CSP), then flipchip packages, and now embedded chip build-up packaging. Advancements in IC chip packaging technology are driven by ever-increasing needs for achieving better performance, greater miniaturization, and higher reliability. New packaging technology has to further provide for the possibilities of batch production for the purpose of large-scale manufacturing thereby allowing economy of scale.

With chip scale packages incorporating multiple, stacked chips, the chips are typically wire-bonded to the substrate, resulting in high electrical resistance, inductance and capacitance, causing degraded device speed and higher power consumption. Flipchip die can not be easily 3D stacked and are mostly limited to side-by-side planar die arrangements, which use large package area or package stacking, thereby causing tall 3D structures. Chips that are sequentially stacked and wirebonded can not be pre-tested as a separate packaged chip, allowing for compounded device final test loss and assembly yield loss that increases production cost.

Advancements in IC chip packaging requirements also pose challenges to the existing embedded chip build-up process. That is, it is desired in many current embedded chip packages to have an increased number of re-distribution layers, with eight or more re-distribution layers being common. The standard embedded chip build-up process, in which the one or more dies are initially placed on the IC substrate and the re-distribution layers are subsequently applied in a layer-by-layer fashion, can lead to warpage in the rerouting and interconnection system, requiring the use of a molded epoxy stress balance layer or metal stiffener.

Accordingly there is a need for a method for embedded chip fabrication that allows for the application of multiple dies in a stacked arrangement with improved electrical interconnect performance. There is a further need for embedded chip fabrication that provides a shorter manufacturing cycle time and allows for the application of multiple re-distribution layers while minimizing warpage of the package without the use of a stiffener.

BRIEF DESCRIPTION OF THE INVENTION

Embodiments of the invention overcome the aforementioned drawbacks by providing a method of chip fabrication in which chips or electrical components in the embedded chip package are provided in a stacked arrangement and are connected to an input/output (I/O) system by way of a direct metallic connection. A plurality of patterned laminate layers having metal interconnects therein directly connect each of the chips or electronic components to the I/O system.

In accordance with one aspect of the invention, an embedded chip package includes a plurality of re-distribution layers joined together in a vertical direction to form a lamination stack, wherein each re-distribution layer includes a plurality of vias formed therein. The embedded chip package also includes a first chip embedded in the lamination stack and comprising a plurality of chip pads, a second chip comprising a plurality of chip pads that is attached to the lamination stack and stacked in the vertical direction with respect to the first chip, and an input/output (I/O) system positioned on an outermost re-distribution layer of the lamination stack. The embedded chip package further includes a plurality of metal interconnects electrically coupled to the I/O system and configured to electrically connect the first chip and the second chip to the I/O system, wherein each of the plurality of metal interconnects extends through a respective via to form a direct metallic connection with one of a metal interconnect on a neighboring re-distribution layer and a chip pad on the first or second chip.

In accordance with another aspect of the invention, a method of forming an embedded chip package includes providing an initial polymer laminate layer and a first chip secured thereto, the first chip having chip pads thereon. The method also includes patterning the initial polymer laminate layer to include a plurality of vias and a plurality of metal interconnects such that a portion of the plurality of metal interconnects extend down through respective vias and are metalized directly to the chip pads on the first chip, providing an additional chip, and providing a plurality of additional polymer laminate layers, wherein a portion of the plurality of additional polymer laminate layers includes a chip opening formed therein for placement of one of the first chip and the additional chip. The method further includes selectively coupling the additional chip and each of the plurality of additional polymer laminate layers to the initial polymer laminate layer and, after the coupling of each of the plurality of additional polymer laminate layers, selectively patterning the additional polymer laminate layer to include a plurality of vias and a plurality of metal interconnects such that each of the plurality of metal interconnects extends through a respective via and is directly metalized to one of a metal interconnect on a neighboring polymer laminate layer and a chip pad on the additional chip. The method also includes electrically coupling a plurality of input/output (I/O) connections to the metal interconnects on an outermost polymer laminate layer of the plurality of additional polymer laminate layers, wherein the I/O connections are electrically connected to the first chip and to the additional chip by way of the plurality of metal interconnects.

In accordance with yet another aspect of the invention, a method for manufacturing a wafer level package includes providing a plurality of chips each having chip pads formed thereon and providing a plurality of polymer laminate layers, wherein each of a portion of the plurality of polymer laminate layers includes a chip opening formed therein for placement of one of the plurality of chips therein. The method also includes assembling a wafer level package using the plurality of chips and the plurality of polymer laminate layers, wherein assembling the wafer level package includes applying a first chip to an initial polymer laminate layer and patterning the initial polymer laminate layer to include a plurality of vias and a plurality of metal interconnects, with each of the plurality of metal interconnects extending down through a respective via to electrically couple the initial polymer laminate layer to the first chip. Assembling the wafer level package also includes selectively applying, in a stacked arrangement, additional polymer laminate layers and additional chips to the initial polymer laminate layer and the first chip and, upon application of each additional polymer laminate layer, patterning the additional polymer laminate layer to form a plurality of vias and a plurality of metal interconnects extending down through the vias, such that the metal interconnects in each of the additional polymer laminate layers electrically couples that polymer laminate layer to a previously applied additional polymer laminate layer or a previously applied additional chip.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIGS. 2-10 are schematic cross-sectional side views of an embedded chip package during various stages of a manufacturing/build-up process according to an embodiment of the invention.

DETAILED DESCRIPTION OF THE PREFERRED EMBODIMENT

The present invention provides for a method of forming an embedded chip package. The embedded chip package is manufactured using patterned laminate re-distribution layers and placement of chips or electrical components relative to the patterned layers. The chips/electrical components in the embedded chip package are provided in a stacked arrangement and are connected to an input/output (I/O) system by way of a direct metallic connection provided by metal interconnects formed in the patterned laminate re-distribution layers.

Embodiments of the invention are directed to build-up of an embedded chip package (ECP) that includes therein a plurality of chips (i.e., dies) and/or electrical components embedded within a plurality of patterned laminate re-distribution layers and arranged in a 3D stacked arrangement. While the chips and/or electrical components embedded in the ECP are referenced below in the embodiments of FIGS. 1-12 specifically as chips, it is understood that other electrical components could be substituted in the ECP for the chips, and thus embodiments of the invention are not limited only to the stacking of chips/dies in an ECP. That is, the use of chips in the ECP embodiments described below should also be understood to encompass other electrical components such as resistors, capacitors, inductors, or other similar devices, that could be provided in a stacked arrangement in the ECP.

Figure 1:
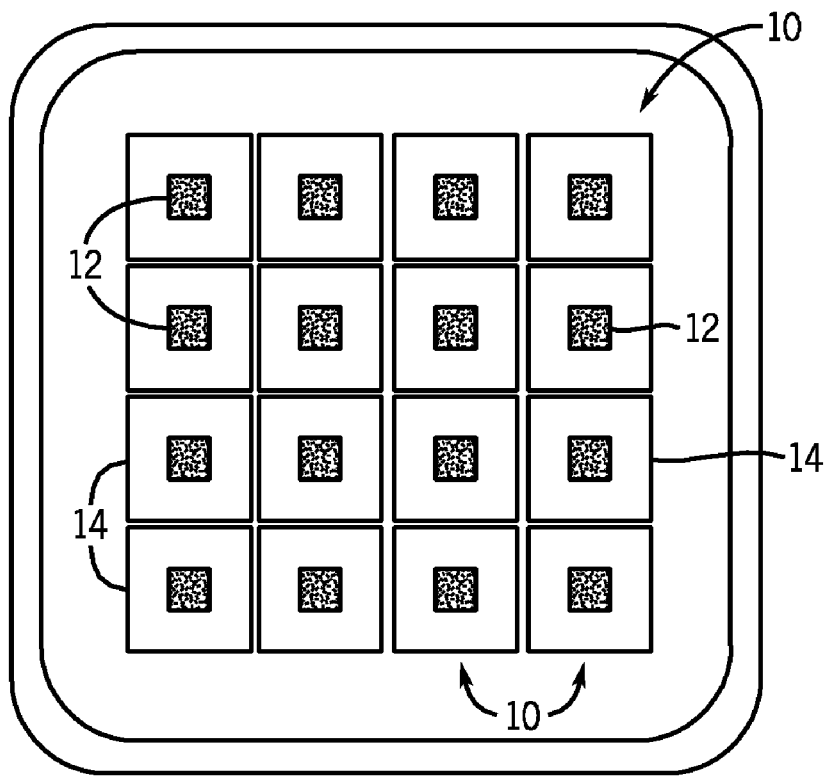
FIG. 1 is a top view of a plurality of embedded chip packages according to an embodiment of the invention.

Referring to FIG. 1, a plurality of manufactured ECPs 10 or embedded chip modules are shown according to an exemplary embodiment of the invention. Each ECP 10 includes one or more chips 12 (i.e., dies) connected with, and embedded in, a plurality of re-distribution layers 14 (i.e., laminate layers). Each chip 12 is formed from a semiconducting material such as silicon or GaAs and is prepared such that an integrated circuit (IC) layout is formed on its surface. Each of the plurality of re-distribution layers 14 is in the form of a pre-formed laminate sheet or film that can be placed relative to the chip(s) 12. The re-distribution layers 14 can be formed of Kapton®, Ultem®, polytetrafluoroethylene (PTFE), or another polymer film, such as a liquid crystal polymer (LCP) or a polyimide material. As shown in FIG. 1, each ECP 10 is formed by dicing through re-distribution layers 14 in an area between adjacent ECPs 10.

Figure 2:
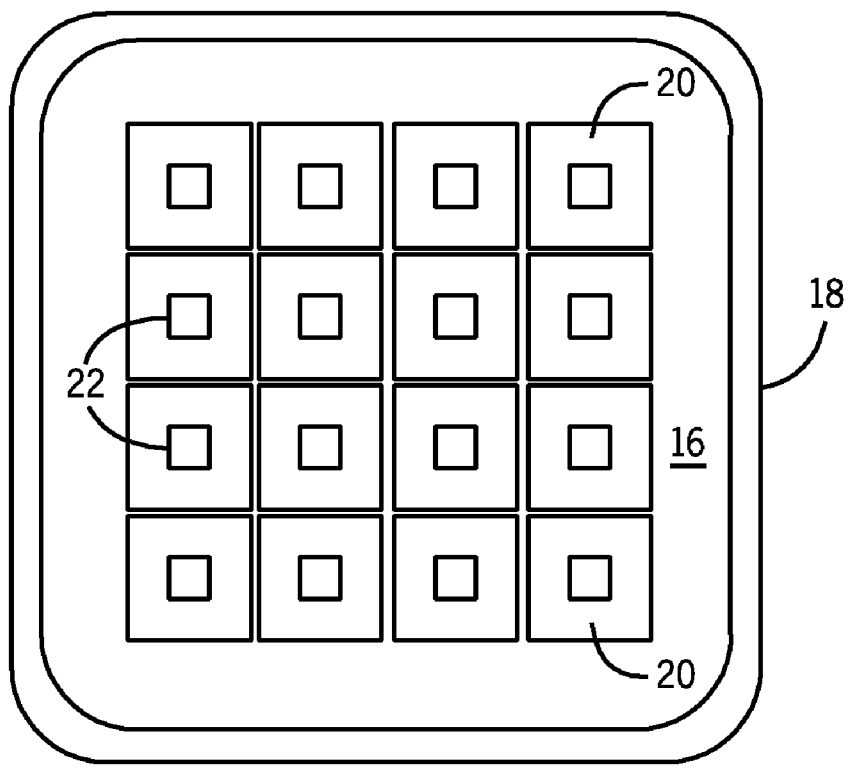

Referring to FIGS. 2-10, a technique for manufacturing a plurality of embedded chip packages (ECPs) 10 is set forth, according to an embodiment of the invention. As shown in FIG. 2, the embedded chip build-up process begins with a complete frame of an initial re-distribution layer 16, which is provided and mounted on a frame 18 to allow for additional manufacturing steps to be performed thereon. As set forth above, the initial re-distribution layer 16 is in the form of a flexible polymer laminate layer, such as Kapton®, Ultem®, polytetrafluoroethylene (PTFE), or another polymer/polyimide film, and is of a size that allows for the production of a plurality of ECPs 10 therefrom. The initial re-distribution layer 16 includes pre-patterned areas 20 thereon and non-patterned areas 22, with the non-patterned areas 22 corresponding to chip areas in which a chip is to be placed.

A portion of the complete frame of the initial re-distribution layer 16 is shown in FIGS. 3A-3B. According to one embodiment of the invention, the initial re-distribution layer 16 is provided as a "pre-patterned" layer having a plurality of base metal interconnects 18 formed thereon in the pre-patterned areas 20, as shown in FIG. 3A. An adhesive layer 24 is applied to one side of the initial re-distribution layer 16 and a chip 26 (i.e., first chip) is placed in the non-patterned area 22. In an exemplary embodiment of the invention, chip 26 has a reduced thickness, such that the total thickness of the chip is approximately 1 to 3 times that of initial re-distribution layer 16 and/or subsequently applied re-distribution layers. This "ultra-thin" chip 26 thus has a thickness that is much less than that of the overall ECP 10, as will be illustrated in the following figures.

As shown in FIG. 3B, upon application of chip 26, the initial re-distribution layer 16 is further patterned to form a plurality of vias 28 which are drilled through the polymer material forming the re-distribution layer. The vias 28 are formed at positions corresponding to base metal interconnects 18, so as to expose the base metal interconnects 18. Additional vias 28 are drilling down to pads 30 on chip, so as to expose these pads. According to an exemplary embodiment, the vias 28 are formed by way of a laser ablation or laser drilling process. Alternatively, it is also recognized that vias 28 may be formed by way of other methods including: plasma etching, photo-definition, or mechanical drilling processes. A metal layer/material 32 (e.g., a seed metal and/or copper) is then applied onto the re-distribution layer 16 by way of, for example, a sputtering or electroplating process, and is then formed into metal interconnects 34. According to one embodiment of the invention, metal layer/material 32 is patterned and etched such that metal interconnects 34 are formed that extend from a front/top surface 36 of initial re-distribution layer 16 and down through vias 28. Metal interconnects 34 thus form an electrical connection with base metal interconnects 18 and a direct metallic and electrical connection to chip pads 30.

Figure 4:
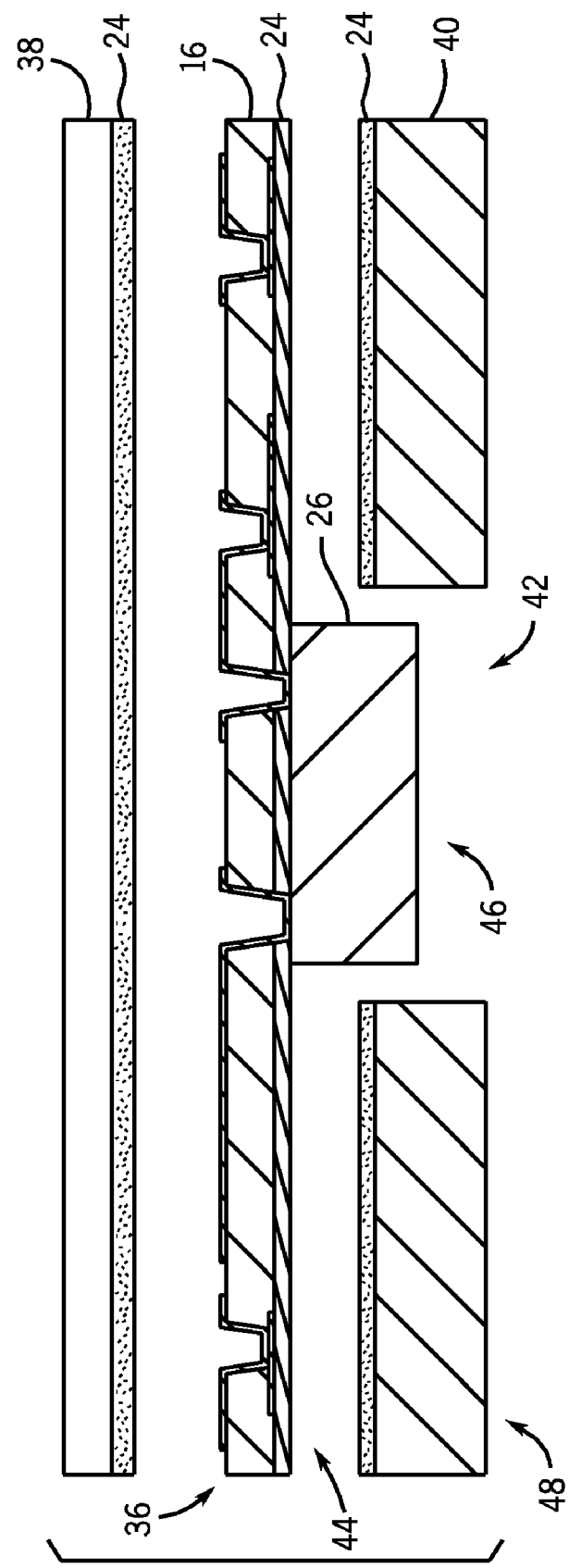

Referring now to FIG. 4, in a next step of the manufacturing technique, additional re-distribution layers 38, 40 are laminated onto the initial re-distribution layer 16. The additional re-distribution layers 38, 40 include an uncut re-distribution layer 38 and a pre-cut re-distribution layer 40 that are applied to front and back surfaces of the initial re-distribution layer 16, respectively. A chip opening 42 (or plurality of chip openings) is formed through the pre-cut re-distribution layer prior to lamination thereof to initial re-distribution layer 16. The chip opening 42 is of a size and shape essentially matching that of a chip (i.e., chip 26) to be placed therein. As shown in FIG. 4, the resulting shape of the pre-cut re-distribution layer 40 is that of a "window frame" construction. While pre-cut re-distribution layer 40 is shown as a single layer in FIG. 4 having a thickness matching that of chip 26, it is also recognized that multiple (e.g., 2 or 3) re-distribution layers having a total thickness matching that of chip 26 could be applied instead of the single pre-cut re-distribution layer 40.

As shown in FIG. 4, an adhesive layer 24 is applied to each of the uncut re-distribution layer 38 and the pre-cut re-distribution layer 40 on a side to be affixed to initial re-distribution layer 16, such as by a lamination, spin, or spray process. Thus, according to an exemplary embodiment of the invention, the initial re-distribution layer 16 forms a "central" re-distribution layer, and the additional re-distribution layers 38, 40 are applied to both the front/top surface 36 and a back/bottom surface 44 of the initial re-distribution layer 16. Such a double-sided lamination process serves to reduce stresses imparted to the initial re-distribution layer 16 and prevent warpage thereof. As shown in FIG. 4, the pre-cut re-distribution layer 40 has an increased thickness as compared to initial re-distribution layer 16. According to one embodiment, pre-cut re-distribution layer 40 has a thickness equal to that of chip 26, such that a back/bottom surface 46 of chip 26 aligns with a back/bottom surface 48 of pre-cut re-distribution layer 40.

Figure 5:
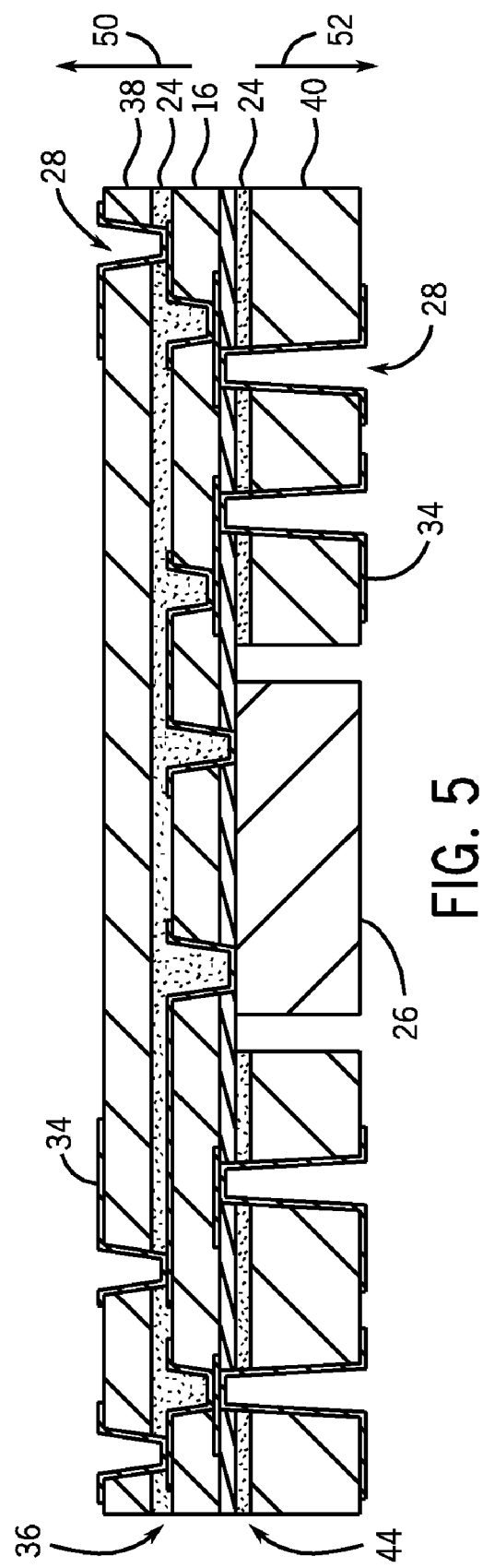

Referring now to FIG. 5, a plurality of vias 28 is formed in each of the additional re-distribution layers 38, 40. Metal interconnects 34 are also formed/patterned to extend down through vias 28 and through each additional re-distribution layer 38, 40, so as to electrically connect each of the additional re-distribution layers 38, 40 to the initial re-distribution layer 16. As shown in FIG. 5, for uncut re-distribution layer 38, extending out in a first direction 50 from the front/top surface 36 of the initial re-distribution layer 16, the vias 28 are formed (i.e., drilled, laser ablated) from a second direction 52 opposite the first direction 50. That is, vias 28 in the uncut re-distribution layer 38 are formed from the top-down. Conversely, for the pre-cut re-distribution layer 40, extending out in the second direction 52 from the back/bottom surface 44 of the initial re-distribution layer 16, the vias 28 are drilled from the first direction 50. That is, vias 28 in the pre-cut re-distribution layer 40 are drilled from the bottom-up.

Figure 6:
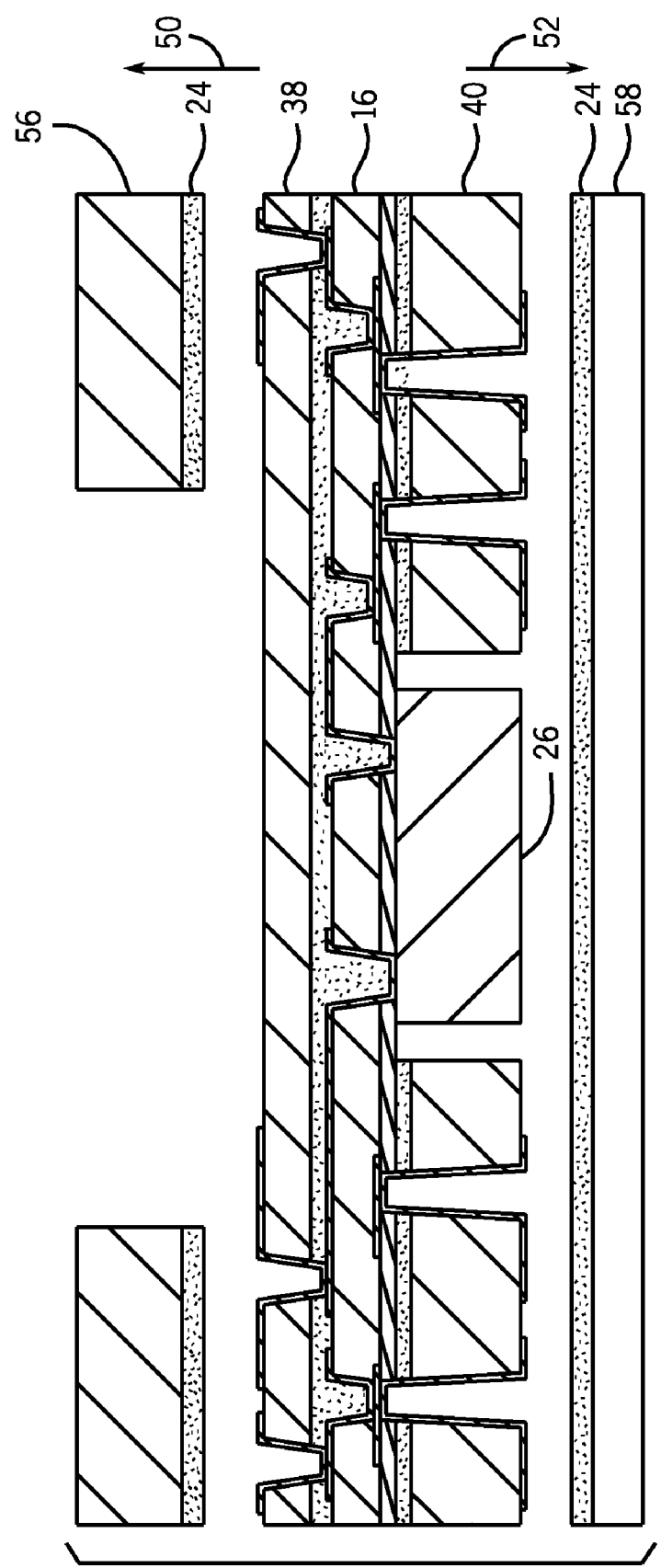
Figure 7:
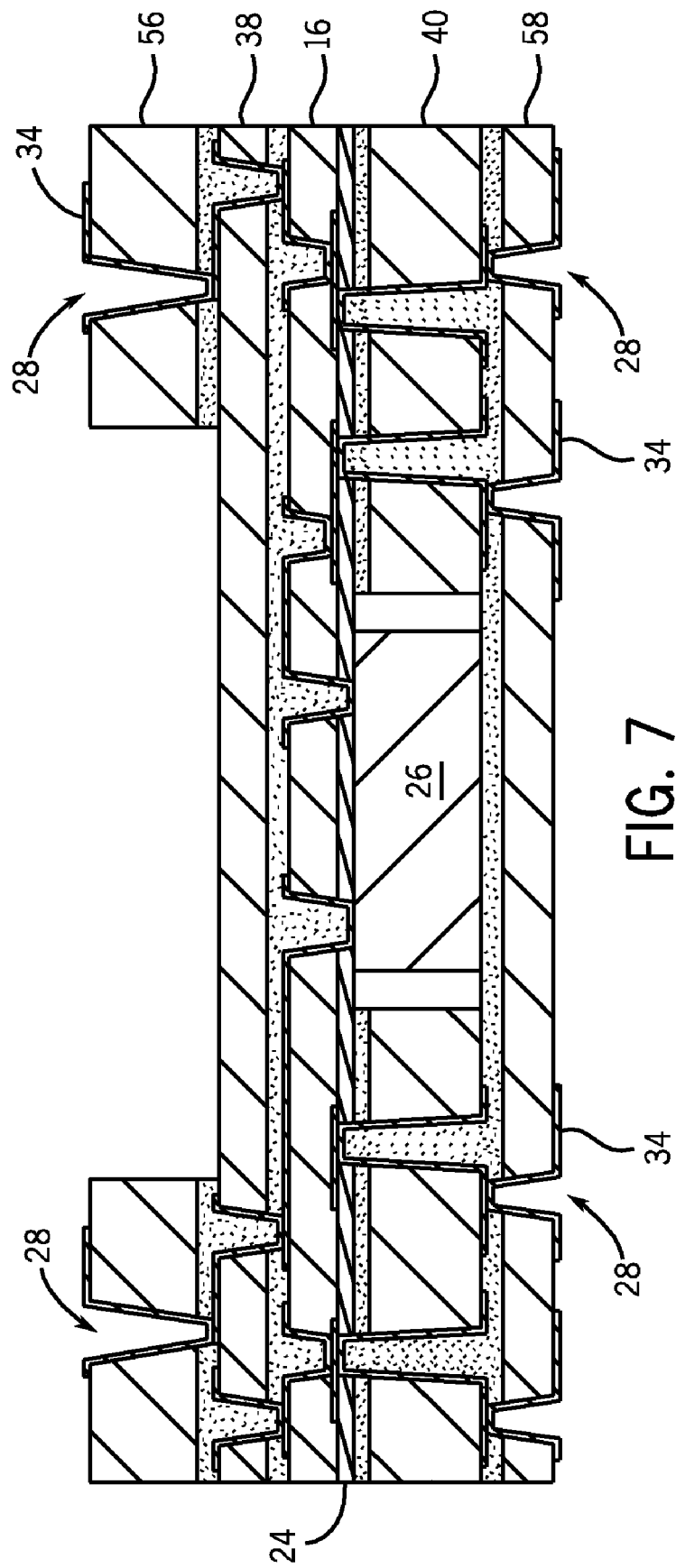

As shown in FIG. 6, further re-distribution layers 56, 58 in the form of an unpatterned pre-cut re-distribution layer 56 and an unpatterned uncut re-distribution layer 58 are added to initial re-distribution layer 16 and to re-distribution layers 38, 40 in a next step of the manufacturing technique. An adhesive layer 24 is applied to each of the pre-cut re-distribution layer 56 and the uncut re-distribution layer 58 to provide a bonding material. The pre-cut re-distribution layer 56 is applied/laminated onto re-distribution layer 38 extending out in first direction 50 from the front/top surface 36 of initial re-distribution layer 16. The uncut re-distribution layer 58 is applied/laminated onto re-distribution layer 40 and onto back/bottom surface 46 of chip 26, extending out in second direction 52 from the back/bottom surface 44 of initial re-distribution layer 16. In a next step of the manufacturing process/technique, and as shown in FIG. 7, a plurality of vias 28 is formed in each of the additional re-distribution layers 56, 58. Metal interconnects 34 are also formed/patterned to extend down through vias 28 and through each additional re-distribution layer 56, 58, so as to electrically connect each of the additional re-distribution layers 56, 58 to the previously applied re-distribution layers 38, 40 and to initial re-distribution layer 16.

Figure 8:
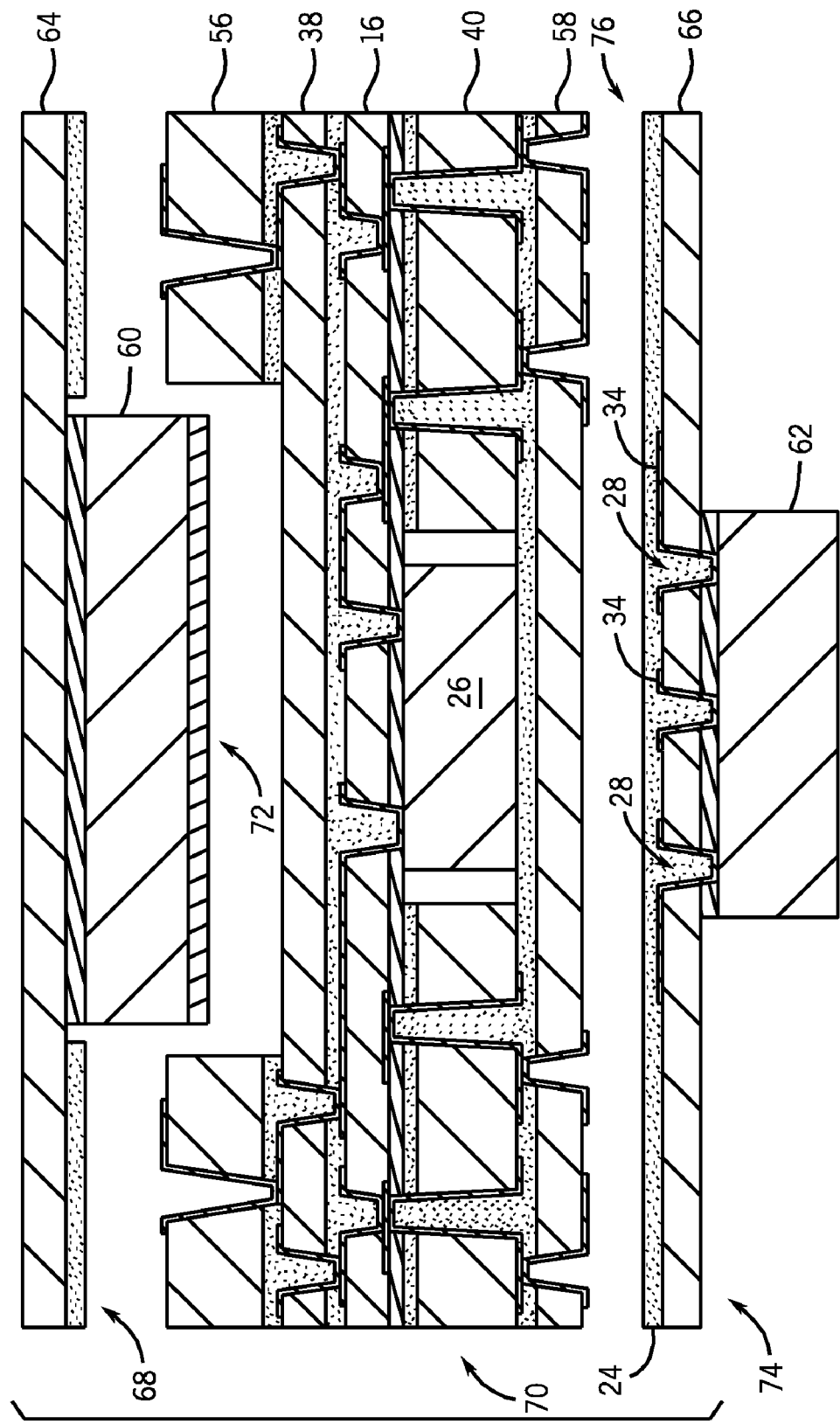

Referring now to FIG. 8, in an exemplary embodiment of the invention, additional ultra-thin chips 60, 62 are added in a next step of the ECBU process. A top chip 60 and a bottom chip 62 are, respectively, attached to additional re-distribution layers 64, 66 via an adhesive layer 24. As shown in FIG. 8, the top chip 60 is applied to an uncut, unpatterned re-distribution layer 64 on a surface 68 thereof facing the existing embedded chip assembly 70. A vacuum lamination and pressure bake curing process can be performed upon placement of the top chip 60 onto the adhesive layer 24 and re-distribution layer 64 to secure the chip 60 thereto. An adhesive layer 24 is then applied to a bottom surface 72 of top chip 60 and surface 68 of re-distribution layer 64 to allow for subsequent placement of the top chip/re-distribution layer structure 60, 64 to the embedded chip assembly 70.

Prior, during, or subsequent to preparation and placement of the top chip/re-distribution layer structure 60, 64, the bottom chip 62 is applied (via adhesive 24) to uncut, unpatterned re-distribution layer 66 on a surface 74 thereof facing away from the embedded chip assembly 70. A vacuum lamination and pressure bake curing process can be performed upon placement of the bottom chip 62 onto the adhesive layer 24 and re-distribution layer 66 to secure the chip 62 thereto. Upon securing of the bottom chip 62 to re-distribution layer 66, the re-distribution layer 66 is patterned to form a plurality of vias 28 therein and metal interconnects 34 that extend down through vias 28 to pads 30 on bottom chip 62. That is, metal interconnects 34 extend down to pads 30 to form a direct metallic and electrical connection to chip pads 30 of bottom chip 62.

Figure 9:
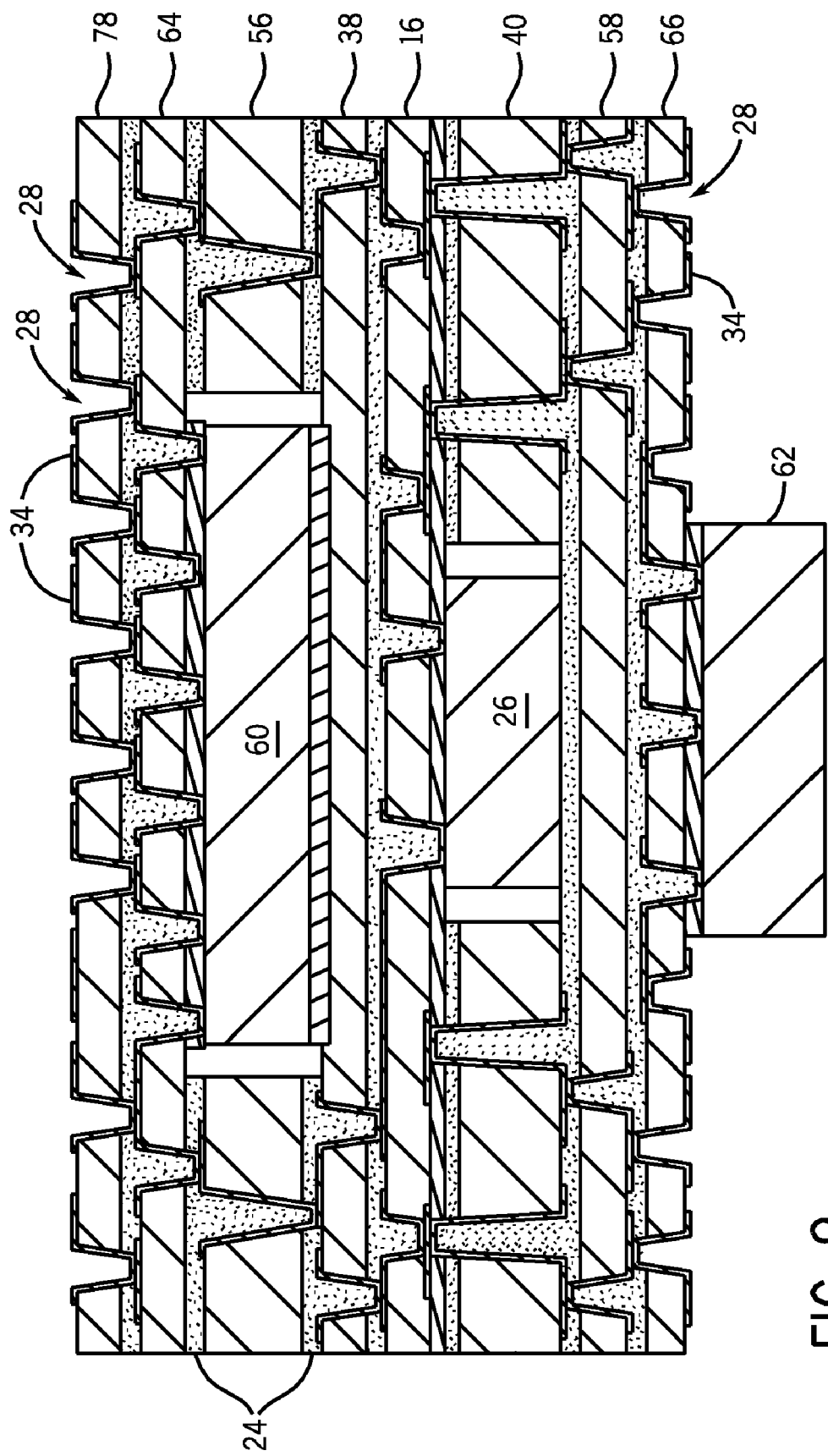

An adhesive layer 24 is then applied to a surface 76 of re-distribution layer 66 facing the embedded chip assembly 70 to allow for subsequent placement of the bottom chip/re-distribution layer structure 62, 66 to the embedded chip assembly 70. Additional patterning of re-distribution layers 64, 66 and placement of further re-distribution layers 78 is performed on the assembly as shown in FIG. 9. Included in this additional patterning is a patterning of re-distribution layer 64, wherein metal interconnects 34 are patterned/etched to extend down thru vias 28, so as to form a direct metallic and electrical connection to chip pads 30 of top chip 60. It is recognized that any number of additional re-distribution layers 78 may be subsequently added to the assembly 70. The additional patterning and placement of re-distribution layers allows for further routing in the assembly, as determined based on design requirements of the ECP 10.

Figure 10:
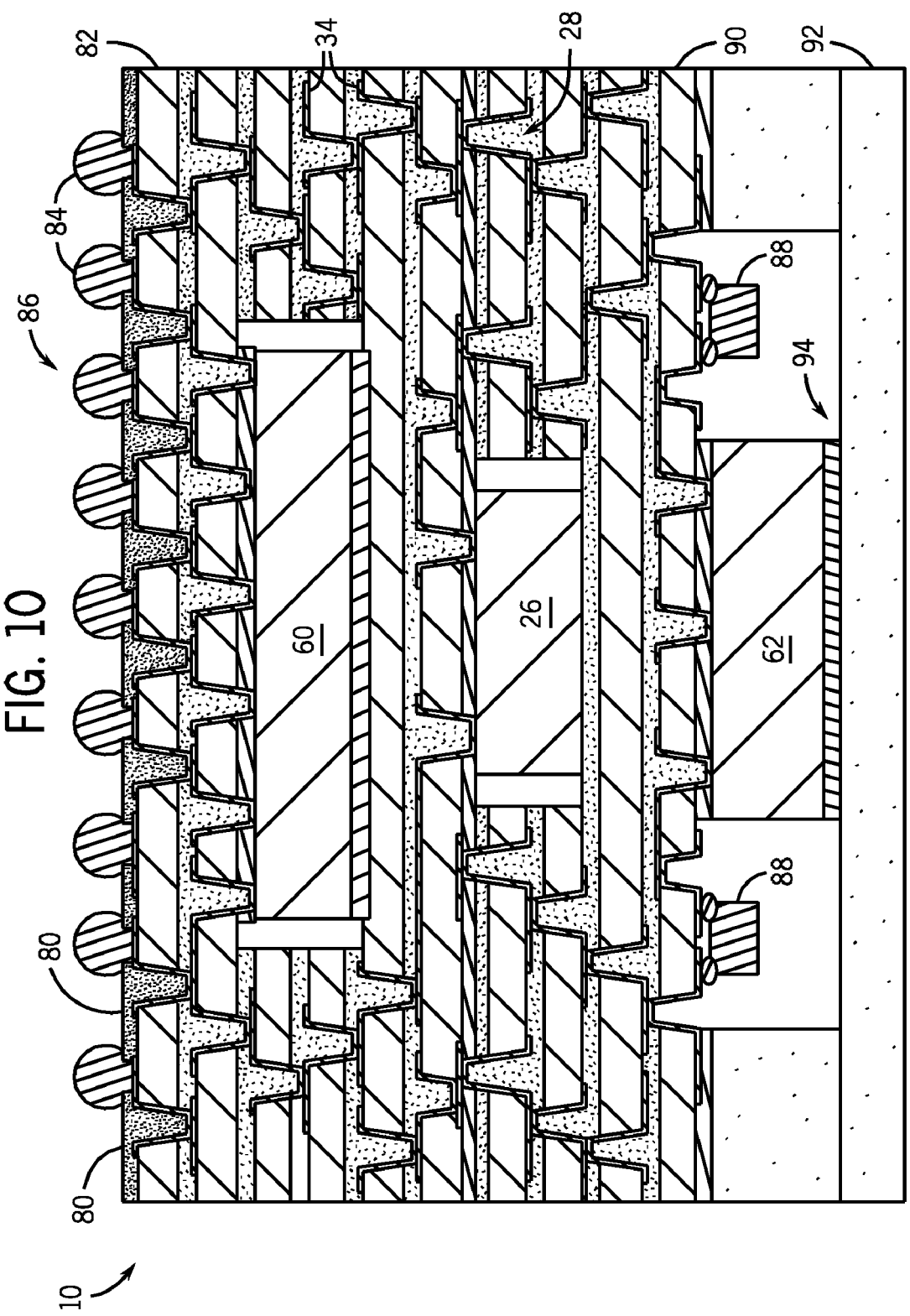

Referring now to FIG. 10, in a next step of the ECBU process, a solder mask layer 80 is applied to an outermost re-distribution layer 82. The solder mask on the outermost re-distribution layer 82 allows for the connection of a plurality of input/output (I/O) interconnections 84. According to one embodiment of the invention, and as shown in FIG. 10, I/O interconnections 84 are applied to solder mask on a topmost re-distribution/laminate layer 82 to form an I/O system interconnection 86. In one embodiment, I/O interconnections 84 are formed as balls that are soldered to solder mask (i.e., solder balls). It is also envisioned, however, that other forms of I/O interconnections 84 can be attached, such as plated bumps, pillar bumps, gold stud bumps, metal filled polymer bumps, or wirebond connections/pads, such that a reliable connection can be formed between the ECP 10 and a motherboard (not shown) to which it is to be attached.

The re-distribution of metal interconnects 34 provided by the plurality of re-distribution layers allows for an increased number of I/O interconnections 84 to be formed on a top surface of ECP 10. That is, for example, solder connections 84 can be more densely packed on ECP 10 due to the re-distribution of metal interconnects 34. Solder connections 84 on ECP 10 are thus formed having a decreased pitch and height as compared to conventional solder balls. For example, solder connections 84 can be formed to have a height of 180 micrometers and a pitch of 80 micrometers. The formation of solder connections 84 at such a size on a flexible polymer laminated/re-distribution layer lowers connection joint stress between the ECP 10 and a motherboard (not shown) to which it is to be mounted, thus also negating the need for an under-filling epoxy mixture that would be applied between the solder connections 84, ECP 10, and a motherboard after soldering of the ECP 10 to the motherboard, as is typically performed in the prior art.

As further shown in FIG. 10, and according to an embodiment of the invention, surface mount passive devices 88 are attached to another outermost re-distribution layer 90 (i.e., bottom-most re-distribution layer). The surface mount devices 88 can be in the form of capacitors, resistor, or inductors that are, for example, soldered onto metal interconnects 34 on the outermost re-distribution layer 90. A heat spreader 92 is also attached to outermost re-distribution layer 90 and bottom chip 62, to disperse heat from ECP 10. Heat spreader 92 may be formed, for example, from a one or two-piece copper plate that is adhered to outermost re-distribution layer 90 and a back surface 94 of bottom chip 62 by way of a thermally conductive adhesive 24. Alternatively, it is recognized that additional re-distribution layers could be applied to outermost re-distribution layer 90 about bottom chip 62 (i.e., a chip opening formed in the additional re-distribution layers to receive chip 62), such that ECP 10 has a flat back/bottom surface, therefore allowing placement/connection of an additional I/O system interconnection thereto.

The resulting ECP 10 shown in FIG. 10 thus includes a plurality of chips 26, 60, 62 therein in a stacked 3D arrangement, with each of the chips having a direct metallic and electrical connection to I/O system interconnection 86 by way of metal interconnects 34. Chips 26, 60, 62 are stacked in a vertical direction with respect to each other so as to form a stacked chip arrangement in the vertical direction. As set forth above, it is understood that other electrical components (resistors, capacitors, inductors, etc.) could be substituted in the ECP 10 for the chips 26, 60, 62, and the stacking of such electrical components in a 3D arrangement in the ECP 10 is considered to be within the scope of the invention.

Figure 11:
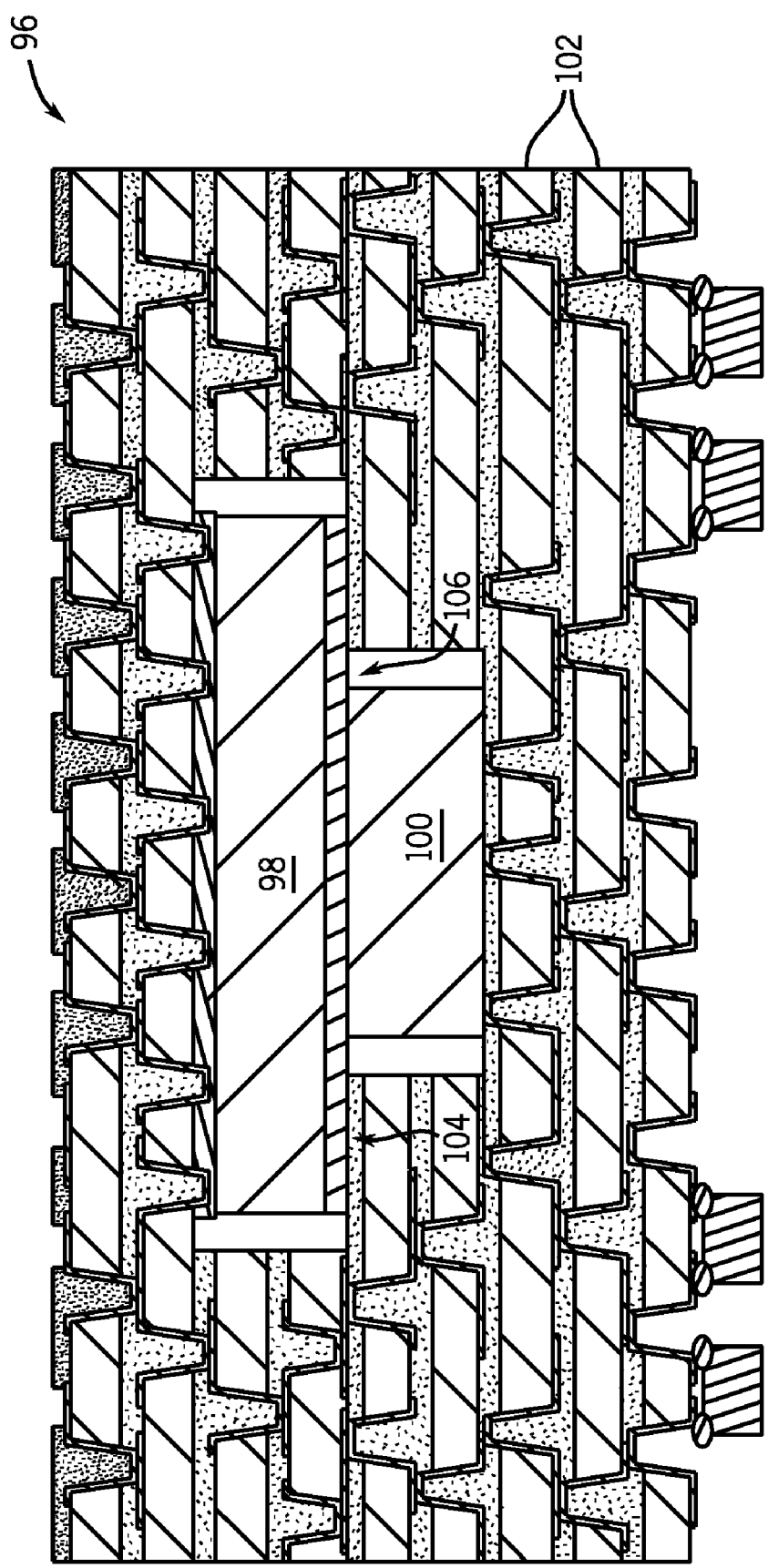
FIG. 11 is a schematic cross-sectional side view of an embedded chip package according to another embodiment of the invention.

Referring now to FIG. 11, according to another embodiment of the invention, an ECP 96 is shown having a first chip 98 and a second chip 100 adhered to one another and embedded within laminate re-distribution layers 102. More specifically, a non-active surface 104 (i.e., back surface) of first chip 98 is adhered to a non-active surface 106 of second chip 100.

Figure 12:
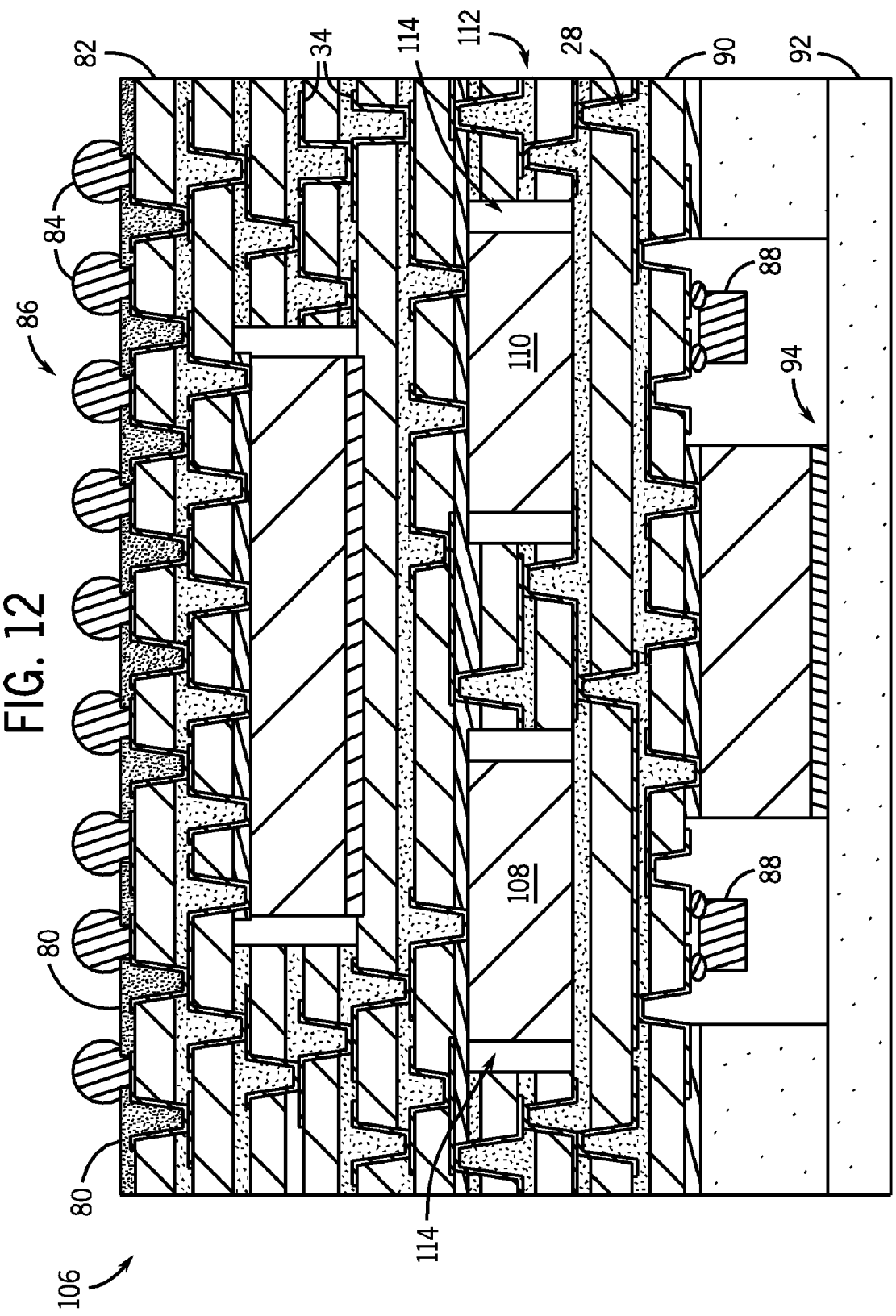
FIG. 12 is a schematic cross-sectional side view of an embedded chip package according to another embodiment of the invention.

As shown in FIG. 12, according to another embodiment of the invention, an ECP 106 includes a first chip 108 and a second chip 110 that are arranged/applied in a common horizontal plane. According to the embodiment of FIG. 12, each of the first and second chips 108, 110 has a thickness matching that of a single re-distribution layer 112, although it is also recognized that chips 108, 110 could have a thickness equal to multiple (e.g., 2 or 3) re-distribution layers having a total thickness matching that of chips 108, 110. Each of the first and second chips 108, 110 are placed within separate a chip opening 114 formed in re-distribution layer 112, so as to be arranged in the same horizontal plane. A plurality of vias 28 and metal interconnects 34 that extend down through vias 28 are patterned in re-distribution layer 112 such that metal interconnects extend to pads 30 on each of first and second chips 108, 110. That is, metal interconnects 34 extend down to pads 30 to form a direct metallic and electrical connection to chip pads 30 of first and second chips 108, 110. The side-by-side embedding of first and second chips 108, 110 on the same plane (i.e. re-distribution layer 112), allows for a reduction in the number of re-distribution layers in the ECP 106, thus helping to reduce overall thickness of the ECP 106 and reduce associated production costs.

According to additional embodiments of the invention, it is recognized that the ECBU process can be performed as a single sided build-up, where additional chips and re-distribution layers are built-up in one direction from an initial re-distribution layer and chip. Additionally, it is recognized that more or less chips can be included in the ECP than shown in the ECPs of FIGS. 10 and 12. Further features such as I/O connections on both outer surfaces of the ECP and power and ground planes throughout the ECP are also envisioned.

According to additional embodiments of the invention, it is further recognized that the embodiments of the ECPs 10 described above can be used in combination with flip-chip or wire-bonded chips. Implementation of the 3D stacked chip arrangement of the ECPs set forth above can be combined with flip-chip or wire-bonded chips to improve performance, miniaturization, and reliability of chip packages over conventional stand-alone flip-chip or wire-bonded chips, as well as stacking capability for flip-chip or wire-bonded chips.

Therefore, according to one embodiment of the invention, an embedded chip package includes a plurality of re-distribution layers joined together in a vertical direction to form a lamination stack, wherein each re-distribution layer includes a plurality of vias formed therein. The embedded chip package also includes a first chip embedded in the lamination stack and comprising a plurality of chip pads, a second chip comprising a plurality of chip pads that is attached to the lamination stack and stacked in the vertical direction with respect to the first chip, and an input/output (I/O) system positioned on an outer-most re-distribution layer of the lamination stack. The embedded chip package further includes a plurality of metal interconnects electrically coupled to the I/O system and configured to electrically connect the first chip and the second chip to the I/O system, wherein each of the plurality of metal interconnects extends through a respective via to form a direct metallic connection with one of a metal interconnect on a neighboring re-distribution layer and a chip pad on the first or second chip.

According to another embodiment of the invention, a method of forming an embedded chip package includes providing an initial polymer laminate layer and a first chip secured thereto, the first chip having chip pads thereon. The method also includes patterning the initial polymer laminate layer to include a plurality of vias and a plurality of metal interconnects such that a portion of the plurality of metal interconnects extend down through respective vias and are metalized directly to the chip pads on the first chip, providing an additional chip, and providing a plurality of additional polymer laminate layers, wherein a portion of the plurality of additional polymer laminate layers includes a chip opening formed therein for placement of one of the first chip and the additional chip. The method further includes selectively coupling the additional chip and each of the plurality of additional polymer laminate layers to the initial polymer laminate layer and, after the coupling of each of the plurality of additional polymer laminate layers, selectively patterning the additional polymer laminate layer to include a plurality of vias and a plurality of metal interconnects such that each of the plurality of metal interconnects extends through a respective via and is directly metalized to one of a metal interconnect on a neighboring polymer laminate layer and a chip pad on the additional chip. The method also includes electrically coupling a plurality of input/output (I/O) connections to the metal interconnects on an outermost polymer laminate layer of the plurality of additional polymer laminate layers, wherein the I/O connections are electrically connected to the first chip and to the additional chip by way of the plurality of metal interconnects.

According to yet another embodiment of the invention, a method for manufacturing a wafer level package includes providing a plurality of chips each having chip pads formed thereon and providing a plurality of polymer laminate layers, wherein each of a portion of the plurality of polymer laminate layers includes a chip opening formed therein for placement of one of the plurality of chips therein. The method also includes assembling a wafer level package using the plurality of chips and the plurality of polymer laminate layers, wherein assembling the wafer level package includes applying a first chip to an initial polymer laminate layer and patterning the initial polymer laminate layer to include a plurality of vias and a plurality of metal interconnects, with each of the plurality of metal interconnects extending down through a respective via to electrically couple the initial polymer laminate layer to the first chip. Assembling the wafer level package also includes selectively applying, in a stacked arrangement, additional polymer laminate layers and additional chips to the initial polymer laminate layer and the first chip and, upon application of each additional polymer laminate layer, patterning the additional polymer laminate layer to form a plurality of vias and a plurality of metal interconnects extending down through the vias, such that the metal interconnects in each of the additional polymer laminate layers electrically couples that polymer laminate layer to a previously applied additional polymer laminate layer or a previously applied additional chip.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An embedded chip package comprising:
   a plurality of polymer laminate re-distribution layers joined together in a vertical direction to form a lamination stack, wherein each polymer laminate re-distribution layer includes a plurality of vias formed therein;
   a first chip embedded in the lamination stack and comprising a plurality of chip pads;
   a second chip attached to the lamination stack and stacked in the vertical direction with respect to the first chip, the second chip comprising a plurality of chip pads;
   an input/output (I/O) system positioned on an outer-most polymer laminate re-distribution layer of the lamination stack; and
   a plurality of metal interconnects electrically coupled to the I/O system and configured to electrically connect the first chip and the second chip to the I/O system, wherein each of the plurality of metal interconnects extends through a respective via and is metalized directly to one of a metal interconnect on a neighboring polymer laminate re-distribution layer and a chip pad on the first or second chip.

2. The embedded chip package of claim 1 further comprising an adhesive layer deposited between each of the plurality of polymer laminate re-distribution layers.

3. The embedded chip package of claim 1 wherein a portion of the plurality of metal interconnects extends onto an outer surface of the outer-most polymer laminate re-distribution layer.

4. The embedded chip package of claim 3 wherein the outer-most polymer laminate re-distribution layer comprises at least one of a topmost re-distribution layer and a bottom-most re-distribution layer; and
   wherein the I/O system is positioned on the portion of the plurality of metal interconnects.

5. The embedded chip package of claim 1 further comprising at least one of a capacitor, an inductor, and a resistor attached to a portion of the plurality of metal interconnects on another outer-most polymer laminate re-distribution layer of the lamination stack.

6. The embedded chip package of claim 5 further comprising a heat spreader attached to the another outer-most polymer laminate re-distribution layer of the lamination stack.

7. The embedded chip package of claim 1 wherein the plurality of polymer laminate re-distribution layers comprises:
   a center re-distribution layer having a first surface facing in a first direction and a second surface facing in a second direction opposite from the first direction;
   at least one first additional re-distribution layer adhered to the first surface of the center re-distribution layer and extending out in the first direction;
   at least one second additional re-distribution layer adhered to the second surface of the center re-distribution layer and extending out in the second direction;
   wherein each of the at least one first additional re-distribution layers adhered to the first surface of the center re-distribution layer comprises a plurality of vias and a plurality of metal interconnects extending thru the vias and onto a surface of the first additional re-distribution layer facing away from the center re-distribution layer; and
   wherein each of the at least one second additional re-distribution layers adhered to the second surface of the center re-distribution layer comprises a plurality of vias and a plurality of metal interconnects extending thru the vias and onto a surface of the second additional re-distribution layer facing away from the center re-distribution layer.

8. The embedded chip package of claim 1 wherein a portion of the plurality of polymer laminate re-distribution layers includes a chip opening formed therein, the chip opening in a respective polymer laminate re-distribution layer in the portion of the plurality of polymer laminate re-distribution layers being sized to receive one of the first chip and the second chip therein.

9. The embedded chip package of claim 8 wherein each of the polymer laminate re-distribution layers having the chip opening formed therein has a thickness approximately equal to a thickness of the chip positioned in its chip opening.

10. The embedded chip package of claim 1 wherein a non-active surface of the first chip is adhered to a non-active surface of the second chip.

11. A method of forming an embedded chip package comprising:
provided an initial polymer laminate layer and a first chip secured thereto, the first chip having chip pads thereon;
patterning the initial polymer laminate layer to include a plurality of vias and a plurality of metal interconnects, such that a portion of the plurality of metal interconnects extend down through respective vias and are metalized directly to the chip pads on the first chip;
providing an additional chip;
providing a plurality of additional polymer laminate layers, wherein a portion of the plurality of additional polymer laminate layers includes a chip opening formed therein for placement of one of the first chip and the additional chip;
selectively coupling the additional chip and each of the plurality of additional polymer laminate layers to the initial polymer laminate layer;
after the coupling of each of the plurality of additional polymer laminate layers, selectively patterning the additional polymer laminate layer to include a plurality of vias and a plurality of metal interconnects such that each of the plurality of metal interconnects extends through a respective via and is directly metalized to one of a metal interconnect on a neighboring polymer laminate layer and a chip pad on the additional chip; and
electrically coupling a plurality of input/output (I/O) connections to the metal interconnects on an outermost polymer laminate layer of the plurality of additional polymer laminate layers, wherein the I/O connections are electrically connected to the first chip and to the additional chip by way of the plurality of metal interconnects.

12. The method of claim 11, further comprising forming the chip opening by one of a laser cutting and a chip punch operation.

13. The method of claim 11, wherein selectively coupling each of the plurality of additional polymer layers comprises coupling an additional polymer layer to a front surface of the initial polymer laminate layer and coupling an additional polymer layer to a back surface of the initial polymer laminate layer.

14. The method of claim 13, wherein patterning each of the additional polymer laminate layers comprises:
forming the plurality of vias in each of the at least one additional polymer layers on the front surface of the initial polymer laminate layer from a first direction; and
forming the plurality of vias in each of the at least one additional polymer layers on the back surface of the initial polymer laminate layer from a second direction.

15. The method of claim 11, wherein forming the plurality of metal interconnects comprises:
depositing a metal material on the polymer laminate layer; and
patterning and etching the metal material to form the metal interconnects.

16. The method of claim 11, further comprising applying one of a laminate adhesive, a spray-coating adhesive, and a spin-on adhesive between adjacent polymer laminate layers and between each chip and adjacent polymer laminate layers.

17. The method of claim 11, further comprising applying passive devices to the metal interconnects on another outermost polymer laminate layer, the passive devices comprising at least one of a capacitor, an inductor, and a resistor.

18. The method of claim 17, further comprising attaching a heat spreader to the another outermost polymer laminate layer.

19. The method of claim 11, wherein selectively applying the additional chip comprises adhering the additional chip directly to the first chip such that a non-active surface of the additional chip is adhered to a non-active surface of the first chip.

20. The method of claim 11 wherein patterning the initial polymer laminate layer and each of the additional polymer laminate layers comprises laser drilling the plurality of vias therein.

21. A method for manufacturing a wafer level package comprising:
providing a plurality of chips, each of the plurality of chips having chip pads formed thereon;
providing a plurality of polymer laminate layers, wherein each of a portion of the plurality of polymer laminate layers includes a chip opening formed therein for placement of one of the plurality of chips therein; and
assembling a wafer level package using the plurality of chips and the plurality of polymer laminate layers, wherein assembling the wafer level package comprises:
applying a first chip to an initial polymer laminate layer;
patterning the initial polymer laminate layer to include a plurality of vias and a plurality of metal interconnects, each of the plurality of metal interconnects extending down through a respective via to electrically couple the initial polymer laminate layer to the first chip;
selectively applying, in a stacked arrangement, additional polymer laminate layers and additional chips to the initial polymer laminate layer and the first chip; and
upon application of each additional polymer laminate layer, patterning the additional polymer laminate layer to form a plurality of vias and a plurality of metal interconnects extending down through the vias, such that the metal interconnects in each of the additional polymer laminate layers electrically couples that polymer laminate layer to a previously applied additional polymer laminate layer or a previously applied additional chip.

22. The method of claim 21 further comprising attaching a plurality of input/output (I/O) connections to the metal interconnects on an outermost polymer laminate layer.

23. The method of claim 21 wherein selectively applying additional polymer laminate layers comprises laminating additional polymer laminate layers to the initial polymer laminate layer using a double-sided lamination process.

24. The method of claim 21 further comprising:
forming the chip opening in each of the portion of the plurality of polymer laminate layers; and
wherein selectively applying the additional polymer laminate layers comprises applying the additional polymer laminate layers in a stacked arrangement such that centers of the chip opening are vertically aligned.

* * * * *